United States Patent
Sumi et al.

(10) Patent No.: US 6,909,368 B2
(45) Date of Patent: Jun. 21, 2005

(54) MAGNETIC FIELD DETECTION DEVICE

(75) Inventors: Kazumasa Sumi, Nagoya (JP); Tomohiko Nagao, Tokai (JP); Yoshinobu Honkura, Tokai (JP); Masaki Mori, Tokai (JP)

(73) Assignee: Aichi Micro Intelligent Corporation, Tokai (JP)

( * ) Notice: Subject to any disclaimer, the term of this patent is extended or adjusted under 35 U.S.C. 154(b) by 198 days.

(21) Appl. No.: 10/273,129

(22) Filed: Oct. 18, 2002

(65) Prior Publication Data

US 2003/0164765 A1 Sep. 4, 2003

(30) Foreign Application Priority Data

Mar. 4, 2002 (JP) .................................... 2002-057436

(51) Int. Cl.[7] .................. G08B 13/18; G08B 13/24; G01R 33/02; G01R 33/04
(52) U.S. Cl. .................. 340/551; 340/552; 324/244; 324/247; 324/249; 324/253; 324/255; 324/260
(58) Field of Search .............. 340/551–557, 340/572.1; 324/244–260

(56) References Cited

U.S. PATENT DOCUMENTS

| | | | | |
|---|---|---|---|---|
| 5,652,512 | A | * 7/1997 | Feintuch et al. | 324/254 |
| 5,831,432 | A | * 11/1998 | Mohri | 324/249 |
| 6,229,307 | B1 | * 5/2001 | Umehara et al. | 324/249 |
| 6,566,872 | B1 | * 5/2003 | Sugitani | 324/249 |

FOREIGN PATENT DOCUMENTS

| | | |
|---|---|---|
| JP | 1-163686 | 6/1989 |
| JP | 6-129855 | 5/1994 |
| JP | 6-204790 | 7/1994 |
| JP | 6-265613 | 9/1994 |
| JP | 2000-258517 | 9/2000 |
| JP | 2000-284029 | 10/2000 |

OTHER PUBLICATIONS

Publication: US 2001/0030537 A1; Honkura et al.; Magnetic Field Detection Device.*

* cited by examiner

*Primary Examiner*—Jeffery Hofsass
*Assistant Examiner*—Lam Pham
(74) *Attorney, Agent, or Firm*—Oblon, Spivak, McClelland, Maier & Neustadt, P.C.

(57) ABSTRACT

The present invention is a magnetic field detection device that makes use of a frequency characteristic affording circuit in order to selectively detect magnetic signals from a frequency domain accurately at a high level of sensitivity. The present invention has a magneto-impedance element, a detector coil and a negative feedback coil which is wound around the magneto-impedance element, and a frequency characteristic affording circuit which affords a frequency characteristics on the negative feedback signal of a negative feedback connecting an output terminal thereof with the negative feedback coil. Using filters as the frequency characteristic affording circuit, the following are possible uses of this magnetic field detection device: a geomagnet detection device for earthquake prediction (using a high-pass filter), a bill validation apparatus for vending machines, etc. (using a low-pass filter), and a magnetic oscillation detection device for a magnetic gate system (using a band-reject filter).

24 Claims, 6 Drawing Sheets

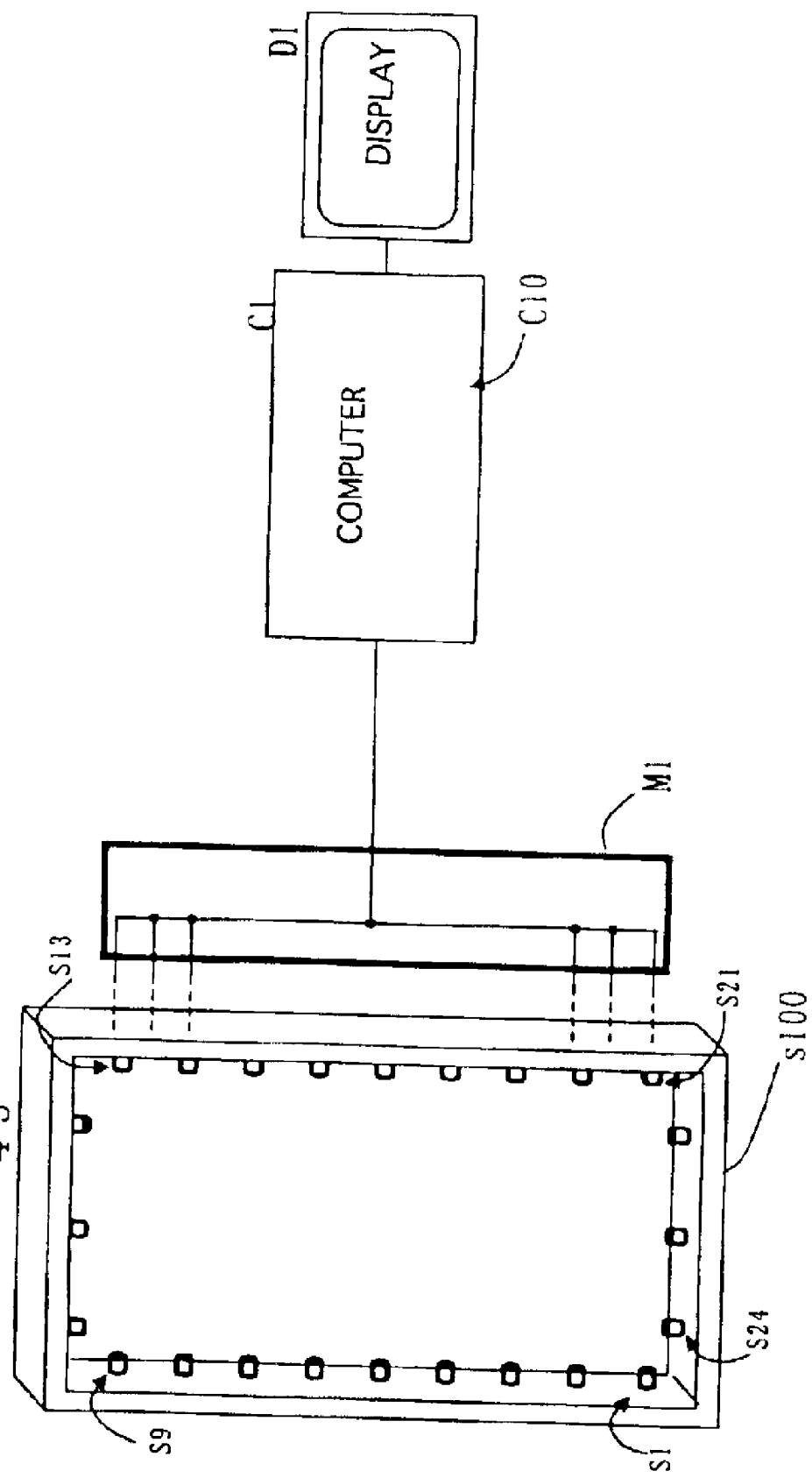

MAGNETIC FIELD DETECTION DEVICE

TECHNICAL FIELD OF THE INVENTION

The present invention relates to a magnetic field detection device which outputs electric signals in response to external magnetic fields.

PRIOR ART

Prior magnetic sensors (Japanese Patent Laid-Open 2000-258517), as shown in FIG. 10, comprising a magneto-impedance element I, whose impedance changes in response to external magnetic fields, a detection coil C, which converts changes in impedance detected through the magneto-impedance element I into electric signals, and a negative feedback coil NC, which can generate a negative feedback magnetic field that cancels the magnetic field around said magneto-impedance element I, offset the external magnetic field by generating a negative feedback magnetic field around magneto-impedance element I with the negative feedback coil NC.

SUMMARY OF THE INVENTION

The presence of magnetic fields on Earth range from natural ones caused by geomagnetism to man-made fields. From the viewpoint of frequency, they range from constant magnetic field to high frequency alternating magnetic field. When one desires to measure a magnetic signal, sometimes the intensity of extraneous magnetic field exceeds the signal component which one aim to measure. Prior magnetic sensors described above can not detect selectively the aimed signal component from extraneous components. When one uses prior magnetic sensors in the case that the aimed signal component level is smaller than extraneous components, the amplification rate suitable for aimed signal component makes the extraneous signal so largely amplified, thus makes the output saturated and detection precision is degraded.

To resolve the above problem, a filter having frequency characteristics that match those of an aimed signal component could be added to the subsequent part to the output of magnetic sensor to filter out the extraneous signal components. However such filters require current amplifier, so the scale of the detecting system becomes large and results in increase of the cost.

The present inventor discovered that by imparting a magnetic characteristic of a frequency response based on the frequency relationship between the desired and extraneous signals to the magnetic field detection device, one could create a magnetic field detection device which detects the desired signal selectively at a high level of sensitivity; this is the basis of the present invention.

For example, if the desired signal is a low-level alternating current and the extraneous signal component is a high-level direct current signal component, the device must be made to detect the magnetic signal component of the alternating current selectively at a high level of sensitivity; alternatively, to measure a low-level direct current signal component when the extraneous signal component is a high-level alternating current signal, the device must be made to detect the magnetic signal of the direct current selectively at a high level of sensitivity; and finally, if the desired signal is in a prescribed frequency range and the extraneous signal is outside that prescribed frequency range, the device must be made to detect the signal in the set frequency domain selectively at a high level of sensitivity.

In a magnetic field detection device, comprising a magneto-impedance element whose impedance changes in response to external magnetic fields, a detection coil which converts changes in impedance detected through this magneto-impedance element into electric signals, and a negative feedback coil which can generate a magnetic field which controls the magnetic field around the magneto-impedance element, the present inventor provided a frequency response imparting means in the negative feedback circuit which connects the output terminal of the magnetic field detection device with said negative feedback coil and, having realized the technical idea of the present invention of affording to the negative feedback signal a frequency characteristics in order to detect the desired signal selectively at a high level of sensitivity and having undertaken the research and development, arrived at the present invention, which makes possible the detection of magnetic signals in the desired frequency domain accurately and selectively with a high level of sensitivity and low cost.

A magnetic field detection device comprises a magneto-impedance element for changing on a magneto-impedance in response to an external magnetic field, a detector coil for converting changes in the magnetic impedance detected by the magneto-impedance element into electric signals, negative feedback coil for controlling the internal magnetic field of said magneto-impedance element, and a frequency characteristics affording means provided in a negative feedback circuit connecting an output terminal thereof with the negative feedback circuit, and for affording a frequency characteristics on negative feedback signals of the negative feedback circuit.

In a first embodiment of the present invention a magnetic field detection device comprises a magneto-impedance element whose impedance changes according to an external magnetic field, a detector coil that converts changes in impedance detected by the magneto-impedance element into electric signals, a negative feedback coil that controls the internal magnetic field of the magneto-impedance element, and a frequency characteristic affording means provided in a negative feedback circuit which connects an output terminal thereof with the negative feedback coil and for affording a frequency characteristics on negative feedback signals of the negative feedback circuit.

A second embodiment of the present invention comprises a magnetic detection device, as described in the first embodiment, in which said frequency characteristic affording means is a filter that affords desired frequency characteristics to the magnetic detection device by zeroing the internal magnetic field of the magneto-impedance element.

The first embodiment, a magnetic field detection device, constituted as described above, imparts a frequency response to the negative feedback signal through the frequency response affording means provided in the negative feedback circuit which connects the output terminal of the magnetic field detection device with the negative feedback coil, thereby resulting in a magnetic field detection device which allows for the detection of the desired magnetic signal in the desired frequency domain selectively and accurately with a high level of sensitivity and low cost.

The second embodiment, a magnetic field detection device, constituted as described above, in the first embodiment, comprises said filter, which forms said frequency response affording means, and serves to afford a frequency characteristics on the magnetic field detection device by zeroing the internal magnetic field of said magneto-impedance element, which allows the magnetic signal components in the desired frequency domain to be detected selectively, thereby resulting in a magnetic field detection device that can detect magnetic signal components in the desired frequency domain accurately with a high level of sensitivity and low cost.

BRIEF DESCRIPTION OF THE DRAWINGS

FIG. 8 is a general view of a magnetic gate system that uses the fourth preferred embodiment of the magnetic field detection device.

EXPLANATION OF THE MARKS 11 is a magneto-impedance (MI) element,
12 is a detection coil,
13 is a negative feedback coil,
70 is a filter,
700 is a negative feedback circuit.

THE PREFERRED EMBODIMENTS OF THE PRESENT INVENTION

The preferred embodiments of the present invention are explained below with use of the attached figures.

The First Preferred Embodiment

Figure 1:
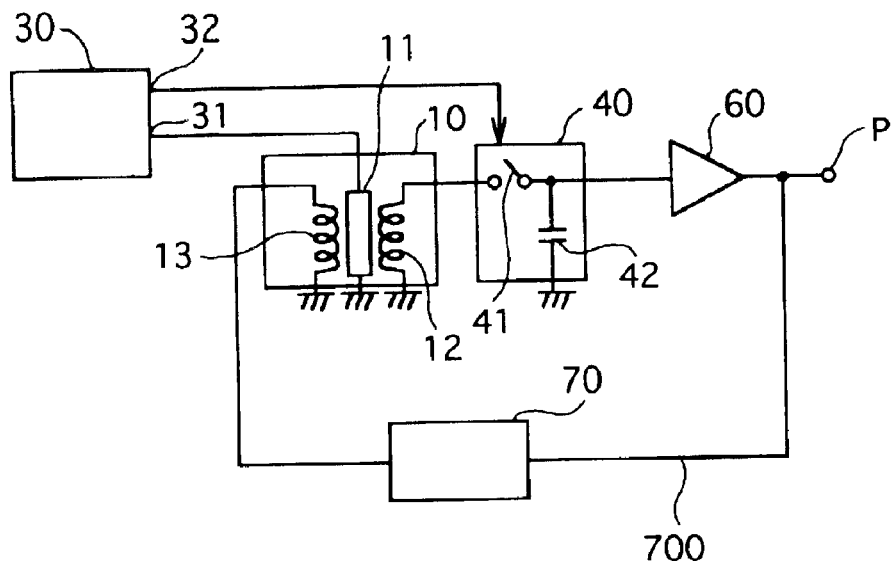
FIG. 1 is a block circuit diagram showing the first preferred embodiment of the magnetic field detection device.

The first preferred embodiment of the magnetic field detection device, as shown in FIG. 1, consists of a magneto-impedance (MI) element 11, whose impedance changes in response to external magnetic fields, a detector coil 12 and negative feedback coil 13 which is wound around MI element 11, and a filter 70 which plays a role as the frequency characteristics affording means or frequency response imparting means which, by means of affording or imparting a frequency characteristics to the negative feedback signal provided in the negative feedback circuit 700 which connects the output terminal of the magnetic field detection device and negative feedback coil 13, allows the magnetic signal component of a frequency characteristics or response in which only the signal components in the negative feedback signal's frequency domain have been substantially diminished to be measured at a high level of sensitivity.

The first preferred embodiment of the magnetic field detection device, in addition to what is written above, comprises, as shown in FIG. 1, a signal generator 30 which generates two synchronized pulses, a detector circuit 40 which is connected to detection coil 12, and an amplifier 60 which amplifies the detector output.

Magneto-impedance element (hereafter called MI element) 11 is connected to an output terminal 31 which is the one of the terminals of said signal generator 30.

MI element 11's impedance changes when its internal magnetic field is affected by external magnetic fields. When a pulse is applied from output terminal 31, MI element 11 passes an electric current according to its impedance. Detector coil 12, which is wound and wrapped around MI element 11, outputs a voltage proportional to the external magnetic field based on said current.

Detector circuit 40 is connected to the other terminal 32 on the other side of signal generator 30. Detector circuit 40 is formed by a sample hold circuit comprising analog switch 41 and capacitor 42, and holds detector coil 12's voltage with a timing determined by the signal from output terminal 32.

Amplifier 60 amplifies the sample hold circuit's voltage and outputs a signal corresponding to the magnetic field from output terminal P.

Filter 70 forms the frequency characteristics imparting means to the negative feedback circuit 700 which connects the magnetic filed detection device's output terminal P with negative feedback coil 13. It passes the electric current to negative feedback coil 13 with a polarity that zeroes the internal magnetic field of said MI element 11.

In the above construction, among the signal components at terminal P, such signals that have frequency characteristics that matches said filter 70 having the frequency is negatively feedback by the negative feedback coil 13.

Because MI element 11's internal magnetic field is offset and weakened almost to zero by said negative feedback, only the signal components in the frequency domain which pass through filter 70, which appears in detector coil 12, become extremely small.

On the other hand, the signals in the frequency domain that could not pass through filter 70 are not subject to negative feedback, so the internal magnetic field of MI element 11 is not weakened, and the magnetic signal converted to voltage by detection coil 12 is left intact, amplified by amplifier 60, and outputted, allowing the magnetic signal components in the desired frequency domain to be detected selectively at a high level of sensitivity.

The first preferred embodiment of the magnetic field detection device succeeds in realizing a frequency selective magnetic field detection device by inserting filter 70 into the negative feedback circuit 700.

The first preferred embodiment of the magnetic field detection device can remove extraneous signals and selectively measure the desired frequency component at a high level of sensitivity. That is to say, it allows for highly accurate measurement without saturating the amplifier with extraneous signal components or lowering the signal-to-noise ratio.

The first preferred embodiment of the magnetic field detection device, because it makes a current amplifier unnecessary by simply inserting filter 70, which requires only a small number of components with a capacitor and a resistor, as a frequency selective circuit into feedback circuit 700, in addition to resolving a problem that plagued prior magnetic sensors, namely that in adding a predetermined frequency response filtering means to the subsequent stage of a magnetic sensor, one required a current amplifier to get the necessary current which in turn increased size and cost (through the need for extra parts), is also advantageous for embodiments of the kind described below (the magnetic oscillation detection device), in which a number of detection devices are used, because it economizes both space and cost.

a low-pass filter, high-pass filter, band pass filter, or band stop filter may be used, in accordance with one's need, for filter 70.

For example, when the desired signal is a low-level alternating current and the extraneous signal component is a high-level direct current, it is necessary to detect the alternating current magnetic signal component selectively at a high level of sensitivity, and thus a low-pass filter may be used.

On the other hand, when the desired signal is a low-level direct current and the extraneous signal component is a high-level alternating current signal component, a high-pass filter may be used.

The Second Preferred Embodiment

The second preferred embodiment of the magnetic field detection device is a geomagnet observation device suitable for measuring geomagnets to the degree of precision necessary for earthquake forecasting and other research, as described below.

Geomagnetism or magnetic fields generated by rocks, is direct current or nearly direct current, that is, ultra-low frequency that oscillates very slowly, and geomagnetic fields are extremely weak. For that reason, the intermixture of man-made alternating current magnetic field signals of motors, generators, etc. becomes an obstacle to measurement. Thereupon the second preferred embodiment has been realized as a magnetic sensor that removes alternating current components and selectively measures only direct current (or nearly direct current) magnetic components at a high level of accuracy.

Figure 2:
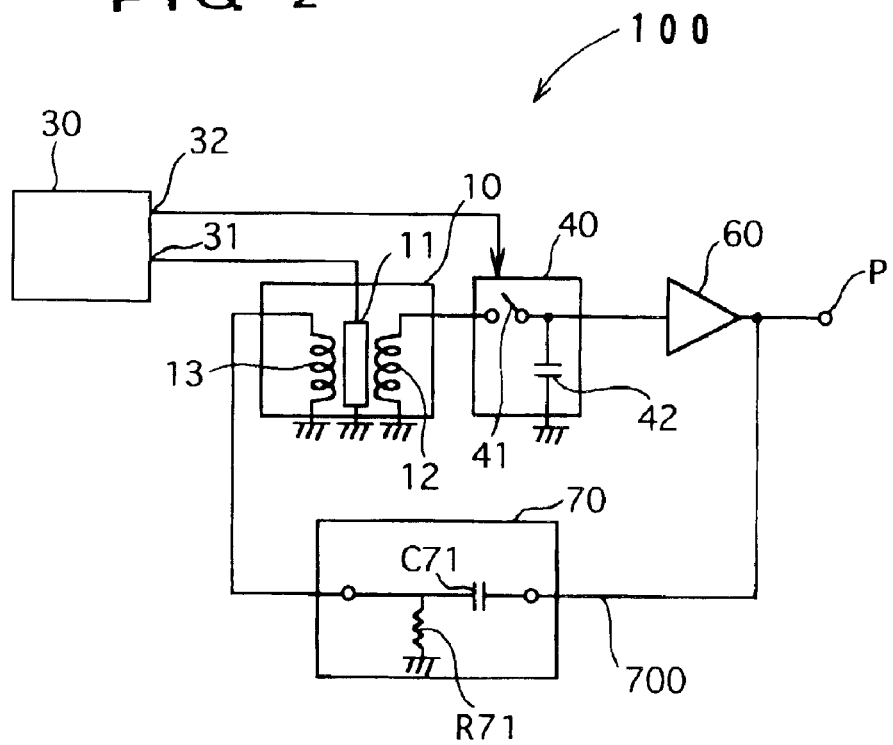
FIG. 2 is a block circuit diagram showing the second preferred embodiment of the magnetic field detection device.

The second preferred embodiment of the magnetic field detection device, shown in FIG. 2, has basically the same electric circuitry as the first preferred embodiment, shown in FIG. 1, but a high-pass filter is now used for filter 70, so the description of the second preferred embodiment focuses on that difference.

Filter 70 is a high-pass filter consisting of capacitor C71 and resistor R71 with a cutoff frequency determined by the product of the capacitor's capacitance and the resistance value; here we take 0.01 Hz as an example cutoff frequency.

One of capacitor C71's electrodes is connected to P, an output terminal of the magnetic field detection device, while the other terminal is connected, along with resistor R71, to negative feedback coil 13, and all alternating current signals greater than 0.01 Hz are subjected to negative feedback.

Hereby, the second preferred embodiment, magnetic field detection device 100, is highly sensitive only to direct current signals less than 0.01 Hz and nearly direct current, that is, ultra-low frequency that oscillates very slowly, and measures only magnetic signals in the desired frequency domain with a high level of accuracy while removing the alternating current magnetic field components that would otherwise disturb the measurement.

Figure 3:
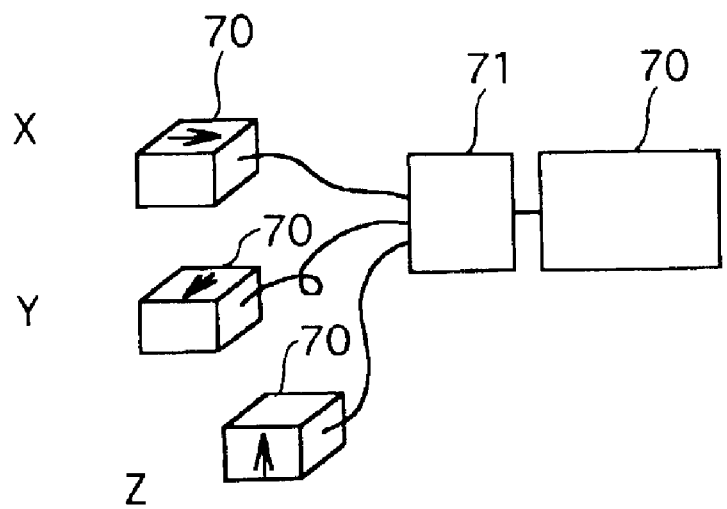
FIG. 3 is a block circuit diagram showing an example of a geomagnetism observation device with three second preferred embodiments of the magnetic field detection device pointing in the x, y, and z directions.

FIG. 3 is an example of a geomagnet observation device constituting three of the second preferred embodiments, magnetic field detection device 100, of FIG. 2, set in x-, y-, and z-directions.

That is to say, the magnetic field detection devices X, Y, and Z are set to hold sensitivity axes in their respective directions, and three-dimensional direct current magnetic components may be measured with the three magnetic field detection devices.

The respective output signals are sent to computer 72 through an A/D converter 71 and processed by software as magnetic vectors with the operation $v(X^2+Y^2+Z^2)$.

The Third Preferred Embodiment

Figure 4:
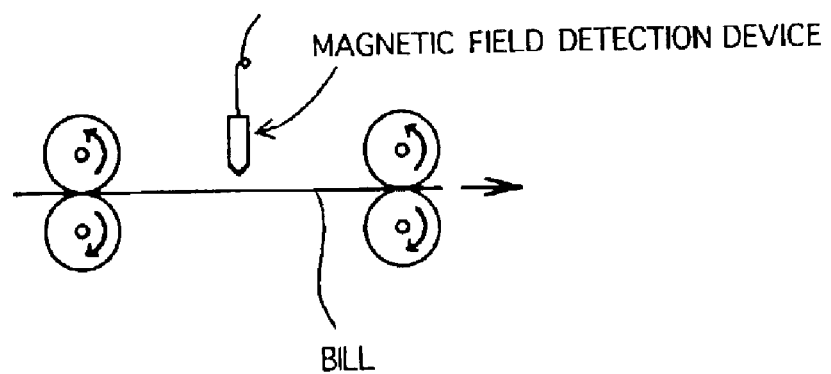
FIG. 4 is a lateral view of an example of a bill validation apparatus constructed from the third preferred embodiment of the magnetic field detection device.

The third preferred embodiment of the magnetic field detection device, as shown in FIG. 4, is a magnetic field detection device suitable for use as a detector of the magnetic fields of magnetic ink, for instance that of paper money.

Typically, bill validators, as shown in FIG. 4, pick up magnetic oscillations from the magnetic ink as the bill is conveyed by roller from the insertion window to the interior of the apparatus, detecting the oscillations in the moment the ink passes near the magnetic field detection device.

Because the ink's magnetic field is extremely faint, a high-sensitivity magnetic field detection is necessary, but increasing the sensitivity of the magnetic field detection device makes it impossible to ignore terrestrial magnetism, and the geomagnetic component increases the magnitude of error depending on the location of the bill validation apparatus, where it is situated (its direction), etc., possibly saturating the magnetic field detection device, and thus must be removed.

On one hand, the magnetic signal that the detector picks up from the ink are pulse signal which can be regarded as modified alternating current signals, while terrestrial magnetism is a direct current component. Therefore a high-accuracy bill validation apparatus may be realized with a magnetic field detection device that can selectively measure only alternating current.

Figure 5:
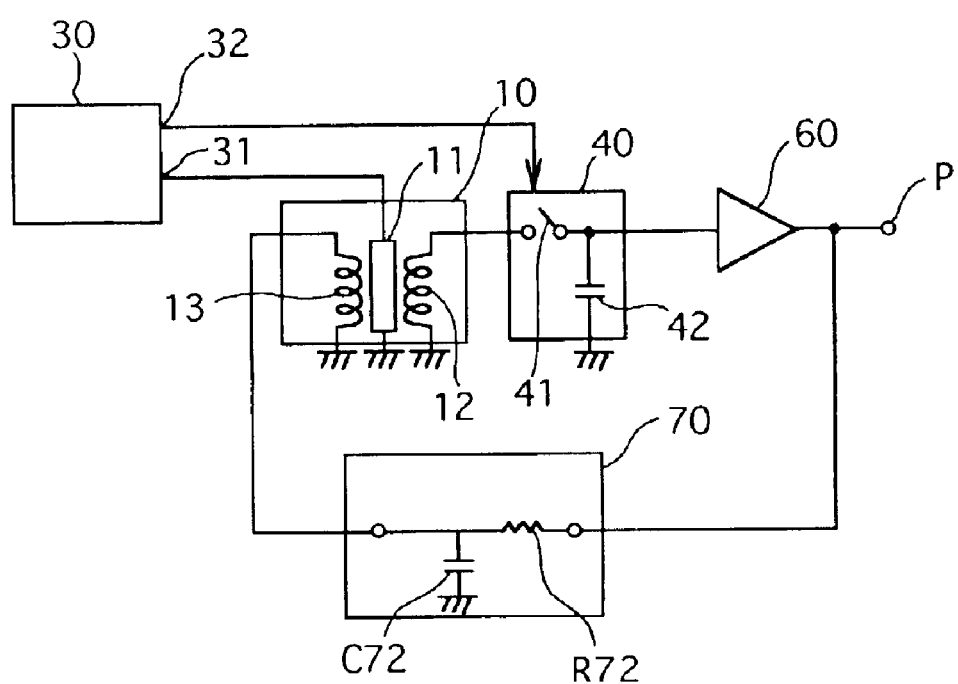
FIG. 5 is a block circuit diagram showing the third preferred embodiment of the magnetic field detection device.

The third preferred embodiment, magnetic field detection device 101, shown in FIG. 5, selectively measures only the alternating current component; its electric circuitry is basically the same as that of FIG. 1, but a low-pass filter is now used for filter 70, so the description of the third preferred embodiment focuses on that difference.

Filter 70 is formed by a low-pass filter consisting of capacitor C72 and resistor R72; the cutoff frequency is determined by the product of the capacitor's capacitance and the resistance value; for the third preferred embodiment we take 10 Hz as the cutoff frequency.

One terminal of resistor R72 is connected to the output terminal of the magnetic field detection device, and the other terminal is connected, along with capacitor C72, to negative feedback coil 13, and all direct current signal components less than 10 Hz are subject to negative feedback.

Hereby, the third preferred embodiment, magnetic field detection device 101, is highly sensitive only to alternating current magnetic signals greater than 10 Hz, and measures only magnetic signals in the desired frequency domain with a high level of accuracy while removing the direct current magnetic field components that would otherwise disturb the measurement.

The Fourth Preferred Embodiment

The fourth preferred embodiment of the magnetic field detection device is a magnetic field detection device suitable for use in a magnetic gate system that can determine whether a person is carrying knives or other magnetic objects.

Magnetic objects, because they are naturally magnetized, generate magnetic oscillations according to the movement of its carriers, but the strength of naturally magnetized magnetic objects is extremely faint; usually, it is even weaker than terrestrial magnetism. For this reason, a magnetic field detection device which measures selectively only the desired magnetic field oscillation component (signal) with high sensitivity is necessary.

In addition, the frequency component of the magnetic field oscillation signal of a magnetized magnetic object held by a moving person that arrives in the magnetic field detection device, assuming the individual moves at a rate between 1 cm/second and 10 m/second, is between 0.01 Hz and 10 Hz.

Figure 6:
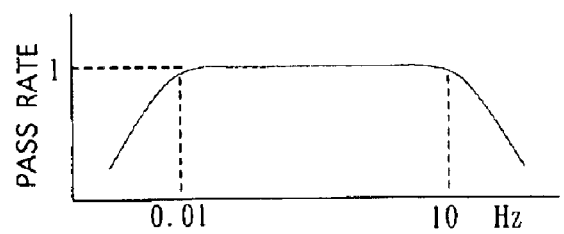
FIG. 6 is a diagram showing the band pass characteristic of the filter in the fourth preferred embodiment of the magnetic field detection device.
Figure 7:
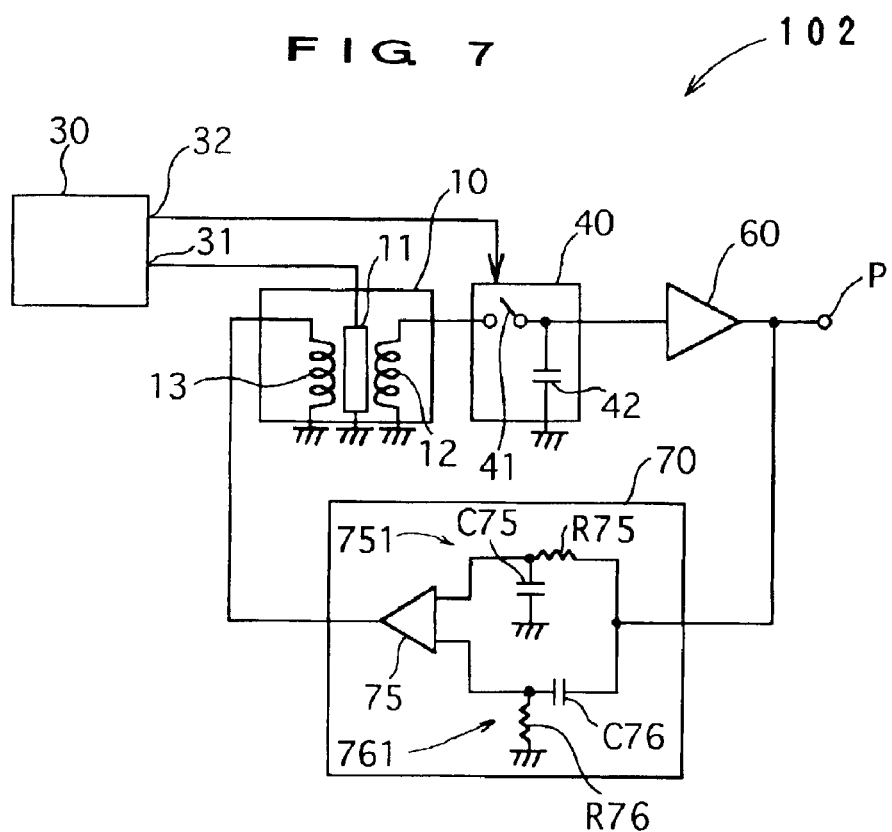
FIG. 7 is a block circuit diagram showing the fourth preferred embodiment of the magnetic field detection device.
Figure 10:
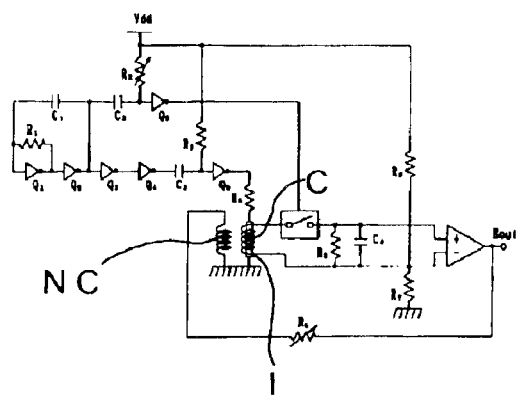
FIG. 10 is a conceptual drawing showing prior magnetic sensors.
Figure 9:
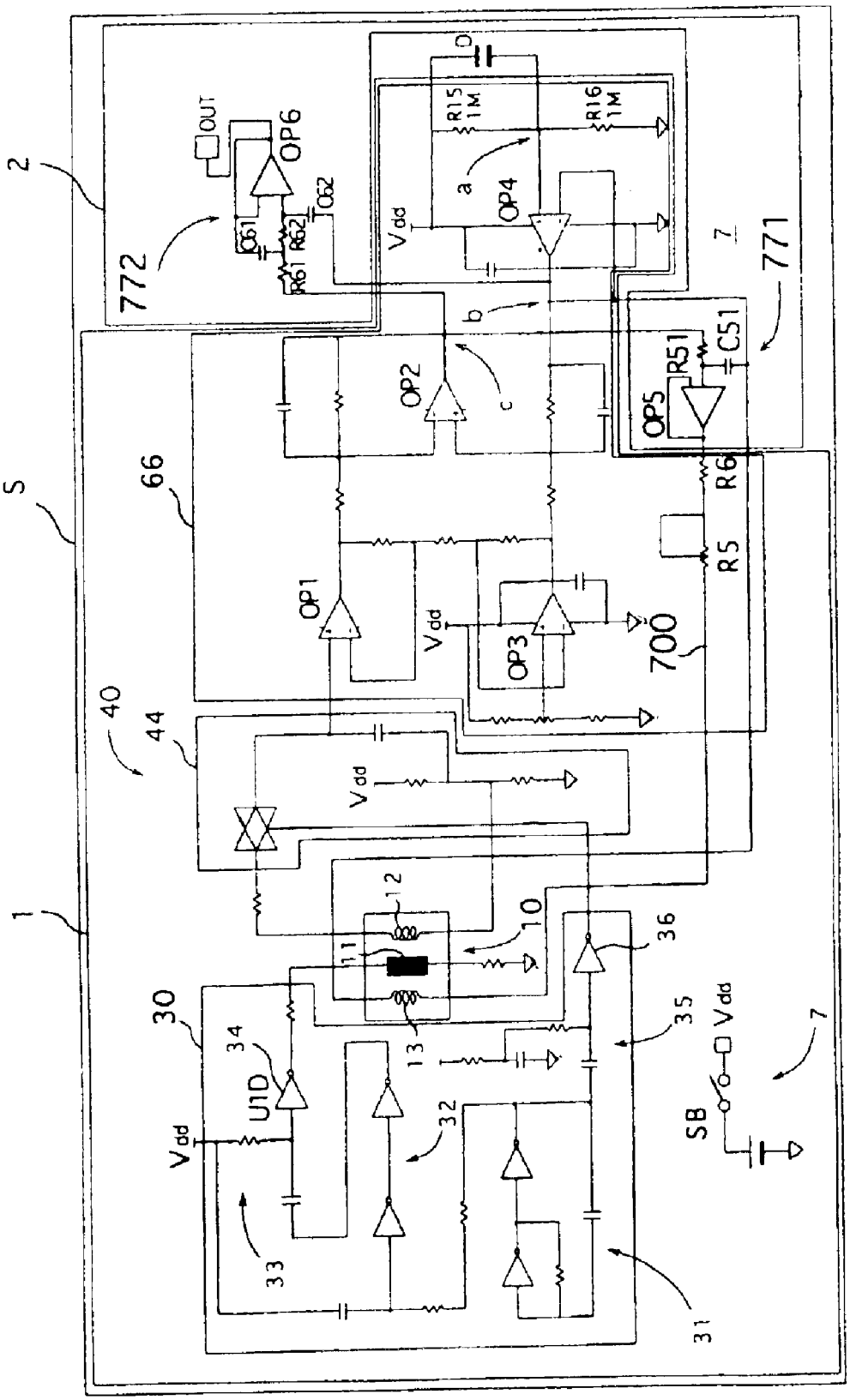
FIG. 9 is a detailed block circuit diagram showing the fourth preferred embodiment of the magnetic field detection device.

In the fourth preferred embodiment, because magnetic signals between 0.01 Hz 10 Hz are selectively detected, both an embodiment, as in FIG. 7, providing a band-reject filter consisting of a low-pass filter (R75, C75) that passes signals under 0.01 Hz and a high-pass filter (R76, C76) that passes signals over 10 Hz to negative feedback circuit 700, or an embodiment, as in FIG. 9, providing a low-pass filter 771 which passes signals under 0.01 Hz to negative feedback circuit 700 and adds second low-pass filter 772, which provides a steep damping characteristic, to the subsequent stage of output terminal P, thereby damping and removing extraneous magnetic signals over 10 Hz, may be employed; both give the frequency response shown in FIG. 6 to magnetic field detection device 102.

As stated above, in the magnetic field detection device shown in FIG. 9, a second low-pass filter 772 is added to the subsequent stage of output terminal P; this serves to increase the measurement accuracy by strongly removing the high-level magnetic noise component caused by the high-level artificial magnetic noise components of motors, computers, etc.

Consequently, the magnetic field detection devices shown in FIGS. 7 and 9 are equivalent, as shown in FIG. 6, in that they are both magnetic field detection devices equipped with a band pass filter characteristic which selectively measures only the magnetic signals in the frequency domain between 0.01 Hz and 10 Hz, and they both make possible a high-accuracy magnetic gate system.

The fourth preferred embodiment, magnetic field detection device 102, shown in FIGS. 6 through 9, is a magnetic field detection device for measuring selectively only the magnetic field signal components between 0.01 Hz and 10 Hz, and the electric circuitry is basically the same as that of the first preferred embodiment, shown in FIG. 1, but a band-reject filter is now used for filter 70, so the description of the fourth preferred embodiment focuses on that difference.

Signal generator 30, as shown in FIG. 9, consists of a capacitor and a logic element and resistor in parallel, and its output terminals 31 and 32 send simultaneous pulses to MI element 11 and detector circuit 40's analog switch 41, respectively.

Filter 70, as shown in FIG. 7, is a band-reject filter comprising capacitors C75 and C76, resistors R75 and R76, and addition amplifier 75. The band-reject filter combines low- and high-pass characteristics. The low-pass cutoff frequency is determined by the product of the capacitance of capacitor C75 and the resistance of resistor R75; here this is 0.01 Hz. The high-pass cutoff frequency is determined by the product of the capacitance of capacitor C76 and the resistance of resistor R76. In the fourth preferred embodiment, this is set to 10 Hz.

One electrode of resistor R75 is connected to P, the output terminal of the magnetic field detection device, and the other electrode is connected, along with capacitor C75, with one input terminal of addition amplifier 75, forming low-pass filter 751.

One electrode of capacitor C76, just like resistor R75, is connected to P, the output terminal of the magnetic field detection device, and the other electrode is connected, along with resistor R75, with the other input terminal of addition amplifier 75, forming high-pass filter 761.

In addition, the output terminal of addition amplifier 75 is connected to negative feedback coil 13, and frequency components lower than 0.01 Hz or higher than 10 Hz are subject to negative feedback. Extraneous signal components less than 0.01 Hz or greater than 10 Hz are thereby removed, creating a high-sensitivity magnetic field detection device that can selectively measure only magnetic field oscillation signals between 0.01 Hz and 10 Hz, that is, in the range corresponding to the movement of magnetic objects.

Amplifier 60 in FIG. 7 (numbered 66 in FIG. 9), as shown in FIGS. 7 and 9, consists of a capacitor and an operational amplifier in parallel with a resistor and outputs a signal to output terminal P.

Frequency selective circuit 7 in FIG. 9 is equivalent to filter 70 in FIG. 7. Low-pass filter 771, which comprises one part of said frequency selective circuit 7, comprises an operational amplifier 5 and a resistor R51 in parallel with capacitor C51 in FIG. 9, holds a cutoff frequency of 0.01 Hz, and is equivalent to the low-pass filter 751 of filter 70 in FIG. 7. Low-pass filter 771 inputs a voltage from output terminal P of amplifier 66, and imparts filter output of less than 0.01 Hz to negative feedback coil 13.

The signal which is detected as a voltage according to the MI element 11's impedance change in response to the external magnetic field passes from detector coil 12 to detector circuit 40, is amplified by amplifier 66, and outputted. The low-frequency signal components of the output signal selected by the low-pass filter 771 are negatively feedbacked and magnetically canceled. Therefore the low-frequency signals, including geomagnetic constant magnetic field, becomes extreamly small.

In FIG. 9, the frequency component that was not passed by low-pass filter 771 of frequency circuit 7, i.e. the magnetic field oscillation component, is amplified in amplifier 66. In this way, inserting frequency selective circuit 7 into negative feedback coil 700 realizes a magnetic oscillation detection device which selectively detects the desired signal components with high sensitivity.

The magnetic oscillation detection device, shown in FIG. 9, in order to consistently exclude the high-level artificial magnetic noise components created by motors, computers, etc., connects low-pass filter 772, which comprises one part of frequency selective circuit 7, to output terminal P of amplifier 66. Low-pass filter 772 consists of an operational amplifier 6 and resistors R61 and R62 in parallel with capacitors C61 and C62, and, by damping the magnetic signal components above the cutoff frequency of 10 Hz, realizes a low-pass filter characteristic, and the performance as a magnetic oscillation detection device in its output terminal OUT, as in the magnetic field detection device of FIG. 7, ultimately realizes a frequency response between 0.01 and 10 Hz, shown in FIG. 6.

The fourth preferred embodiment of the magnetic field detection device is suitable as a magnetic gate system, as shown in FIG. 8.

The gate itself comprises an aluminum frame 45 of a width humans can pass through, and the frame interior of this gate 4 is provided with 24 magnetic oscillation detection devices S1 through S24. All 24 magnetic oscillation detection devices have the same characteristics, so one will be explained as a representative example.

Each output terminal OUTs of said 24 magnetic oscillation detection devices are connected to multiplexer M1, and the magnetic field oscillation signals are sent sequentially to computer C1.

Computer C1 checks to see if the magnetic field oscillation level is greater than a predetermined level, and thereby determines whether the subject possesses a magnetic object and the region of possession and displays the result on the screen, thereby allows for the precise detection of the possession of magnetic objects and the region of possession The embodiments described above were used as examples, and the present invention is not limited to such constructions; rather, refinements and additions, so long as they are not technical ideas of the present invention more than what a person skilled in the art could recognize from the scope of the patent application, the detailed explanation of the invention and the attachment of diagrams, are possible.

The embodiments described above were explained through an example with the detector coil and the negative feedback coil as two separate coils, but the present invention is not limited to such a construction; rather, it may be possible to employ an embodiment in which the function of the detector coil and the function of the negative feedback coil are handled by a single coil.

What is claimed is:

1. A magnetic field detection device comprising:
   a magneto-impedance element whose impedance changes according to an external magnetic field,
   a detector coil that converts changes in impedance detected by said magneto-impedance element into electric signals,
   a negative feedback coil that controls the internal magnetic field of said magneto-impedance element, and
   a frequency characteristic affording means provided in a negative feedback circuit which connects an output terminal thereof with said negative feedback coil and for affording a frequency characteristics based on the frequency relationship between desired and extraneous signals of a detected magnetic signal on negative feedback signals of said negative feedback circuit, wherein the desired magnetic signal in the desired frequency domain is selectively detected with a high level of sensitivity, by removing the extraneous signal from the detected magnetic signal based on the negative feedback signal having the afforded frequency characteristics.

2. A magnetic field detection device as defined in claim 1, wherein said frequency characteristics affording means is a filter which gives a frequency characteristics to said magnetic field detection device by zeroing the internal magnetic field of said magneto-impedance element.

3. A magnetic field detection device as defined in claim 2, wherein said filter is a high-pass filter.

4. A magnetic field detection device as defined in claim 2, wherein said filter is a low-pass filter.

5. A magnetic field detection device as defined in claim 2, wherein said filter is a band-reject filter.

6. A magnetic field detection device as defined in claim 2, wherein the impedance of said magneto-impedance element changes by the change on the internal magnetic field thereof created by the changes on the external magnetic field, and said detection coil, which is wound around said magneto-impedance element, generates a voltage based on the current passed according to said impedance.

7. A magnetic field detection device as defined in claim 6, further comprising:
   a signal generator configured to output a pulse current;
   a detector circuit connected with said detector coil configured to output the detector output; and
   an amplifier configured to amplify the detector output.

8. A magnetic field detection device as defined in claim 7, wherein said signal generator outputs the generated pulse current to said magneto-impedance element and said detector circuit.

9. A magnetic field detection device as defined in claim 8, wherein said detector circuit comprises a sample hold circuit comprising an analog switch and a capacitor, which is configured to hold the output voltage of said detector coil with timing provided by the pulse outputted by said signal generator.

10. A magnetic field detection device as defined in claim 9, wherein said negative feedback coil is configured to offset and subject to negative feedback the internal magnetic field of said magneto-impedance element, which is created and changed by the external magnetic field, with a polarity which zeroes by canceling the internal magnetic field.

11. A magnetic field detection device as defined in claim 1, wherein said frequency characteristic affording means is configured for selectively detecting only the desired frequency component by removing the extraneous signal from the magnetic signal.

12. A magnetic field detection device as defined in claim 10, wherein said filter is a high-pass filter comprising a capacitor and resistor with a cutoff frequency of 0.01 Hz.

13. A magnetic field detection device as defined in claim 12, wherein said device comprises three magnetic field detection devices aligned in sensitivity axes of the X, Y, and Z directions, forming a geomagnet observation device that measures three dimensional direct current magnetic field components.

14. A magnetic field detection device as defined in claim 13, wherein the output signals from the three magnetic field detection devices are sent to a computer through an A/D transducer and processed by software as magnetic vectors with the operation $\sqrt{(X^2+Y^2+Z^2)}$.

15. A magnetic field detection device as defined in claim 10, wherein said filter is a low-pass filter comprising a capacitor and resistor with a cutoff frequency of 10 Hz.

16. A magnetic field detection device as defined in claim 15, wherein said device is a bill validation apparatus configured to remove the direct current geomagnetic component and to detect the pulse-type alternating current magnetic signals from paper ink.

17. A magnetic field detection device as defined in claim 10, wherein said filter is a band-reject filter comprising a low-pass filter which passes signals under 0.01 Hz and a high-pass filter which passes signals over 10 Hz.

18. A magnetic field detection device as defined in claim 17, wherein said signal generator is formed by a logic element and resistor in parallel and a capacitor and simultaneously outputs pulse signals to said magneto-impedance element through one output terminal and to the analog switch of said detector circuit through the other output terminal.

19. A magnetic field detection device as defined in claim 18, wherein said filter is a band-reject filter comprising two capacitors and resistors provided in series or parallel in a parallel circuit and addition amplifier, and provides the characteristics of both a low-pass filter and a high-pass filter.

20. A magnetic field detection device as defined in claim 19, wherein the output terminal of an addition amplifier is configured to be connected to said negative feedback coil, subject signal components under 0.01 Hz and above 10 Hz to negative feedback, remove the extraneous signal components under 0.01 Hz and over 10 Hz, and selectively measure only the magnetic fluctuation signals from 0.01 Hz to 10 Hz, which correspond to the movement of magnetic objects.

21. A magnetic field detection device as defined in claim 19, wherein said device forms a magnetic gate system comprising a gate made of an aluminum frame of a width large enough for a person to pass through and provides magnetic detection devices spaced at intervals on the inside of the top, bottom, right and left sides of the gate.

22. A magnetic field detection device as defined in claim 21, wherein said device comprises a multiplexer connected to the output terminals of the magnetic detection devices set in the body of said gate, a computer which receives the magnetic fluctuation signals successively and determines through signal processing whether the magnetic field fluctuations from each magnetic fluctuation signal are above a predetermined magnitude, and a display which shows whether the person passing through the gate is carrying a magnetic object such as a knife and the location of possession.

23. A magnetic field detection device, comprising:
  a magneto-impedance element whose impedance is configured to change according to an external magnetic field signal, the external magnetic field signal comprising a desired signal component and an extraneous signal component;
  a detector coil configured to convert changes in impedance detected by said magneto-impedance element into electric signals;
  a negative feedback coil configured to control the internal magnetic field of the magneto-impedance element; and
  a filter provided in a negative feedback circuit connected to the negative feedback coil, the filter being configured to cause a detection of the desired signal component of the external magnetic field signal at a level of sensitivity higher than a level of sensitivity of the extraneous signal component of the external magnetic field signal based on a frequency relationship between the desired and extraneous signal components.

24. The magnetic field detection device according to claim 23, wherein the filter is configured to substantially remove the extraneous signal component from the external magnetic field signal detected by the magnetic field detection device.

* * * * *